(12) United States Patent
Bonser et al.

(10) Patent No.: US 6,320,137 B1
(45) Date of Patent: Nov. 20, 2001

(54) FLEXIBLE CIRCUIT WITH COVERPLATE LAYER AND OVERLAPPING PROTECTIVE LAYER

(75) Inventors: Lora C. Bonser, Austin; Terry F. Hayden, Round Rock; Robert J. Schubert, Cedar Park, all of TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/547,090

(22) Filed: Apr. 11, 2000

(51) Int. Cl.[7] ............................. H05K 1/00; H05K 1/03
(52) U.S. Cl. .................. 174/255; 174/254; 174/260; 361/749; 361/750; 361/751; 361/760; 361/777
(58) Field of Search .................................. 174/255, 254, 174/260, 257, 258, 259, 261, 52.1, 52.4; 361/760, 749, 750, 751, 776, 777; 257/737, 738, 778

(56) References Cited

U.S. PATENT DOCUMENTS

| | | | |
|---|---|---|---|
| 3,716,907 | * | 2/1973 | Anderson ............................. 438/120 |
| 4,081,601 | * | 3/1978 | Dinella et al. ...................... 174/257 |
| 4,605,471 | * | 8/1986 | Mitchell ................................. 216/18 |
| 4,684,678 | | 8/1987 | Schultz et al. ....................... 523/466 |
| 4,987,100 | | 1/1991 | McBride et al. ..................... 437/206 |
| 5,197,902 | * | 3/1993 | Cesar ................................... 439/492 |
| 5,227,008 | | 7/1993 | Klun et al. ........................... 156/630 |
| 5,334,487 | | 8/1994 | Kindl et al. .......................... 430/312 |
| 5,444,188 | * | 8/1995 | Iwayama et al. .................... 174/261 |
| 5,557,844 | | 9/1996 | Bhatt et al. ........................... 29/852 |
| 5,590,465 | * | 1/1997 | Santo ..................................... 29/884 |
| 5,680,701 | | 10/1997 | Sippel ................................... 29/852 |
| 5,726,501 | * | 3/1998 | Matsubara ............................ 257/778 |
| 5,736,780 | | 4/1998 | Murayama ........................... 257/673 |
| 6,022,466 | * | 2/2000 | Tamarkin et al. .................... 205/126 |
| 6,028,357 | * | 2/2000 | Moriyama ............................ 257/737 |
| 6,217,987 | * | 4/2001 | Ono et al. ............................ 428/209 |
| 6,225,569 | * | 5/2001 | Hashimoto et al. ................. 174/260 |

FOREIGN PATENT DOCUMENTS 0 886 313 A1 12/1998 (EP) .
WO 98/25303 6/1998 (WO) .

* cited by examiner

Primary Examiner—Albert W. Paladini
Assistant Examiner—Ishwar B Patel
(74) Attorney, Agent, or Firm—Darla P. Fonseca

(57) ABSTRACT

A printed circuit including a dielectric substrate and a conductive trace attached to a surface of the dielectric substrate. The trace includes a base layer and a coverplate layer on a portion of the base layer. The coverplate layer defines a coverplate edge on the base layer. A protective layer is formed on a portion of the coverplate layer. The protective layer extends beyond the coverplate edge onto at least a portion of the base layer of the trace. A key aspect of the present invention is that the protective layer overlaps the coverplate edge of each trace to reduce the potential for corrosion of the base layer at the coverplate edge.

11 Claims, 3 Drawing Sheets

FLEXIBLE CIRCUIT WITH COVERPLATE LAYER AND OVERLAPPING PROTECTIVE LAYER

FIELD OF THE INVENTION

The invention disclosed herein relates generally to circuit substrates and electronic packages. More specifically, the invention relates to flexible circuit substrates including, one or more traces and an overlapping protective layer for protecting an interface between a base layer and coverplate layer of each trace.

BACKGROUND OF THE INVENTION

Flexible circuits generally include a plurality of conductive traces that are supported on a base substrate such as a layer of flexible dielectric material. A key aspect of flexible circuits is that they offer attributes such as fine pitch traces, complex circuit designs and flexibility. Electronic packages, medical devices, hard disk drive suspensions and ink jet printer pens are common applications for flexible circuits. U.S. Pat. Nos. 4,987,100; 5,227,008; 5,334,487; 5,557,844 and 5,680,701 disclose processes for fabricating printed circuits having a flexible polymeric base substrate such as polyimide or polyester.

In some applications, flexible circuits may be exposed to an aggressive environment that promotes corrosion of the conductive traces. The conductive traces and the interface between the conductive traces and the base substrate are two areas susceptible to being adversely affected by environmental conditions such as exposure to corrosive fluids and moisture. To minimize the potential for corrosion, the conductive traces may include a corrosion resistant coverplate layer formed on a core or base layer of the conductive traces. It is common for the base layer to be made of a material susceptible to corrosion such as copper and for the coverplate layer to be made of a material resistant to corrosion such as gold, tin or palladium.

Gold is a preferred material for the coverplate layer in many applications. A coverplate layer made of gold exhibits excellent electrical conductivity, corrosion resistance and bonding performance. However, a gold coverplate layer is an expensive component of a flexible circuit. The cost associated with the coverplate layer can become excessive when the entire surface or nearly the entire surface of the base layer of each trace is plated with a coverplate layer made of a material such as gold, tin or palladium.

Some flexible circuits have a coverplate layer on only a portion of each trace to reduce the quantity, and therefore the cost, of the coverplate material. In most applications, the coverplated portions of the traces are functional areas used for bonding or testing of the circuit, or areas that need superior environmental protection in the end use environment. The portion of each trace that is not coverplated is often covered with a protective layer, such as a photoimageable or screen printed covercoat or adhesive film, to reduce the potential for corrosion of the base layer of the traces.

It is known in the art to use a selectively patterned protective layer as a photomask for the coverplate material. Subsequent to forming the patterned protective layer, the coverplate layer is formed on the base layer of the traces using a method such as electroplating or electroless plating. In both methods, the coverplate layer is formed on the base layer of the conductive traces, but not on the protective layer. After the coverplate layer is formed, the protective layer is left in place. This technique is more cost effective than applying a corrosion resistant coverplate layer to the entire circuit. However, this circuit fabrication technique results in the presence of an abutting interface between the protective layer and the coverplate layer. The inherent flexibility of flexible circuits, shrinkage of the protective layer and physical changes associated with thermal cycling of the protective layer contribute to reduced reliability and increased susceptibility to corrosion at the abutting interface.

Therefore, what is needed is a circuit construction and manufacturing process that reduces the potential for corrosion at the interface between the base layer and coverplate layer of a trace without requiring the entire base layer to be plated with a corrosion resistant coverplate layer.

SUMMARY OF THE INVENTION

It has been discovered that corrosion resistant flexible circuits coverplated with a material such as gold can be manufactured using a process that permits a cost-effective, reliable and versatile construction to be achieved. In one embodiment of the present invention, accordingly, a printed circuit includes a dielectric substrate and a conductive trace attached to a surface of the dielectric substrate. The trace includes a base layer and a coverplate layer on a portion of the base layer. The coverplate layer defines a coverplate edge on the base layer. A protective layer is formed on a portion of the coverplate layer. The protective layer extends beyond the coverplate edge onto at least a portion of the base layer of the trace.

Circuits according to the present invention exhibit a reduced potential for corrosion at the interface between the base layer and coverplate layer of a trace. In a process according to the present invention, circuits can be fabricated using reduced quantities of coverplate material to produce a circuit without an abutting interface between the protective layer and the coverplate layer. Furthermore, the process permits all of the inherent benefits and advantages of conventional flexible circuit constructions to be achieved.

The constructions described herein include a unique "overlap" of the protective layer (adhesive laminate, covercoat, etc.) over the coverplate edge. The overlap portion of the protective layer improves the reliability of the final product by encapsulating the base layer, particularly at the edge of the coverplate layer, protecting it from adverse environmental conditions. This feature is particularly important for products that rely on their flexibility and ability of undergo repeated thermal cycling. Prior constructions exhibit an abutting interface between the protective layer and the coverplate edge. In these prior constructions, the abutting interface is readily compromised due to flexing, thermal cycling of the circuit and shrinkage of the protective layer after plating. These conditions provide a preferential site at the abutting interface for corrosion of the base layer of the trace.

Preferred materials for the dielectric substrate include polymeric films made of materials such as polyimide and polyester. Copper is a preferred material for the conductive trace and gold is a preferred material for the coverplate layer.

Circuits according to the present invention may be constructed in a number of configurations to prevent corrosion of the base layer of the trace. In a circuit configuration, the protective layer covers all of the portions of the base layer not having a coverplate layer thereon. In another circuit configuration, the protective layer is formed on only a portion of the base layer of the trace. In yet another circuit configuration, the protective layer is formed on the base layer of the trace and on the dielectric substrate.

Another embodiment of the present invention provides an electronic package including a flexible dielectric substrate and a plurality of conductive traces attached to a surface of the dielectric substrate. Each one of the traces includes a base layer, a coverplate layer on a portion of the base layer, a supported portion mounted on the dielectric substrate and a first interconnect portion extending from an edge of the dielectric substrate. The coverplate layer defines a coverplate edge on the base layer. A protective layer is formed on a portion of the coverplate layer and on at least a portion of the base layer of each trace The protective layer extends beyond the coverplate edge onto at least a portion of the base layer. An aperture extends through the dielectric substrate adjacent to each trace. A second interconnect portion of each trace is exposed within the aperture. An interconnect member is mounted on the second interconnect portion of each trace. An electronic device is mounted adjacent to the protective layer. The electronic device includes a plurality of bonding pads. Each one of the bonding pads are electrically connected to the first interconnect portion of a corresponding one of the traces.

A further embodiment of the present invention provides a process for making a printed circuit. The process includes forming a trace layer including a conductive base layer on a surface of a dielectric substrate. The trace layer is patterned to define a plurality of traces having a first interconnect portion extending from a respective edge of the dielectric substrate and a supported portion mounted on a surface of the dielectric substrate. A coverplate layer is formed on the first interconnect portion of each trace whereby a coverplate edge is defined on a supported portion of each trace. A protective layer is formed on at least a portion of the first interconnect portion of each trace extending beyond the coverplate edge onto the base layer the respective trace.

The following terms have the following meanings when used herein:

1. The term "base layer" refers to a conductive layer of material formed on the dielectric substrate. The base layer is typically a thick layer of a relatively inexpensive material such as copper.
2. The term "coverplate layer" refers to a layer of conductive material formed over a portion of the base layer of each trace for enhancing corrosion resistance and electrical performance at bonding and test sites of the circuit.
3. The term "protective layer" refers to a layer of non-conductive material formed over portions of the base layer of each trace for limiting exposure of non-coverplated portions of the base layer to adverse environmental conditions and for improving electrical and mechanical characteristics such as bonding.
4. The term "coverplate edge" refers to the perimeter region of the coverplate layer.
5. The term "first interconnect portion" refers to an interconnect portion of each trace such as a spanning lead, wire bond lead, solder pad, or adhesive pad.
6. The term "second interconnect portion" refers to an interconnect portion of the trace such as a solder ball pad.
7. The term "aperture" refers to an opening in a layer of the dielectric substrate. The aperture may extend through a portion of the dielectric substrate, or may extend completely therethrough. Apertures may be formed by a variety of techniques including mechanical punching, chemical milling, and laser ablation.
8. The term "flowable coverplating mask" refers to a coverplating mask made from a material that is capable of being displaced through flow of the material under the application of heat and/or pressure.

DETAILED DESCRIPTION OF THE INVENTION

Circuits according to the present invention are useful in electronic packages such as ball grid arrays, chip scale packages, single and multiple metal layer packages and the like. Electronic packages can be designed for use in any electronic device, including but not limited to recording devices, printing devices, single or multimedia devices, projectors, cameras, computers, data storage devices, and the like.

Figure 1:
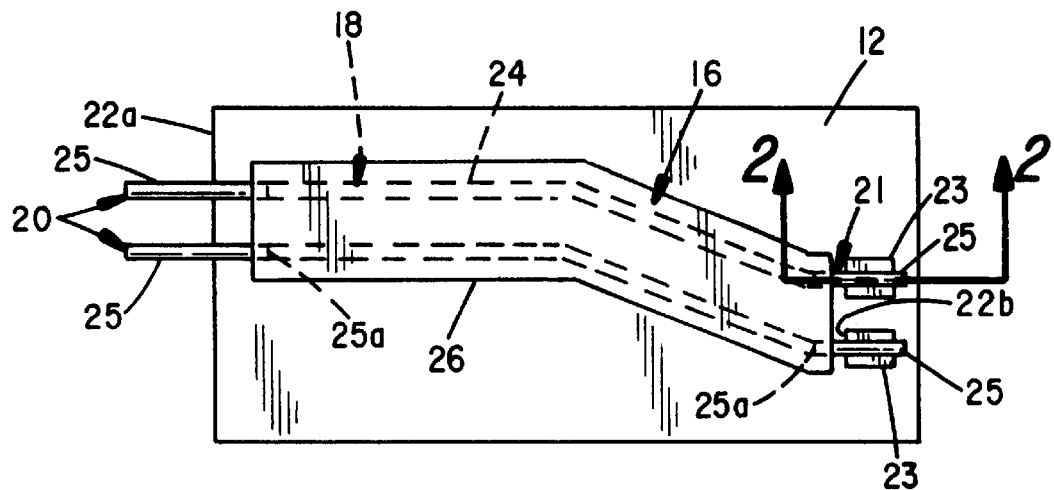
FIG. 1 is a plan view illustrating an embodiment of a circuit according to the present invention.
Figure 2:
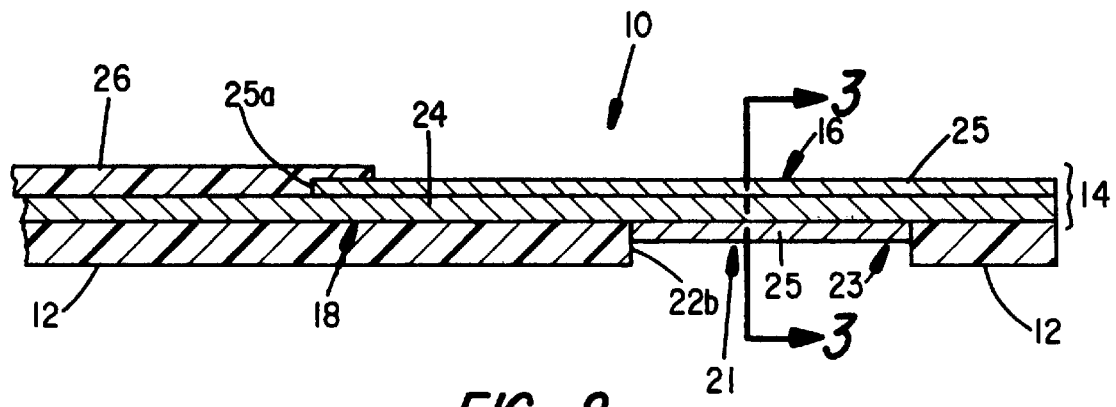
FIG. 2 is a fragmentary cross sectional view taken along the line 2—2 in FIG. 1.

An embodiment of a circuit 10 according to the present invention is illustrated in FIGS. 1 and 2. The circuit 10 includes a dielectric substrate 12 and a conductive trace layer 14 attached to a side of the dielectric substrate 12. The conductive trace layer 14 is patterned to include one or more traces 16. Each trace 16 includes a supported portion 18 that is mounted on the dielectric substrate 12, a first interconnect portion 20 and a second interconnect portion 21. The first interconnect portion 20 is a cantilevered lead that extends in an unsupported configuration from an edge 22a of the dielectric substrate 12, and the second interconnect portion 21 is a spanning lead that extends from an edge 22b of the dielectric substrate 12. The edge 22a is defined by a perimeter edge of the dielectric substrate 12 and the edge 22b is defined by an aperture 23 such as a window formed in the dielectric substrate 12. In other embodiments of the present invention, not shown, the first and second interconnect portions 20, 21 are both supported by the dielectric substrate 12.

Figure 3:
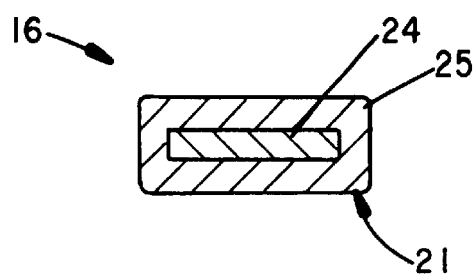
FIG. 3 is a cross sectional view taken along the line 3—3 in FIG. 2.

The conductive trace layer 14 includes a base layer 24 and a coverplate layer 25 formed on a portion of the trace 16. The coverplate layer 25 defines a coverplate edge 25a on the supported portion 18 of the trace 16. A protective layer 26 is formed on a portion of the coverplate layer 25. The protective layer 26 extends beyond the coverplate edge 25a onto at least a portion of the base layer 24 of the trace 16. The coverplate layer 25, FIG. 3, covers all of the surfaces of the interconnect portions 20, 21 that extend from a respective edge 22a, 22b of the dielectric substrate 12, substantially encapsulating the corresponding interconnect portion 20, 21. In other embodiments, the coverplate layer 25 may be formed on less than all of the surfaces of the interconnect portions 20, 21 as deemed necessary by a particular application of the circuit 10.

In many circuit constructions, the base layer 24 is made of a relatively inexpensive material such as copper; the coverplate layer 25 is made of a material with exceptional electrical and corrosion resistance such as gold, palladium or tin; and the dielectric substrate 12 is made from a flexible polymeric film such as polyimide or polyester.

Figure 4:
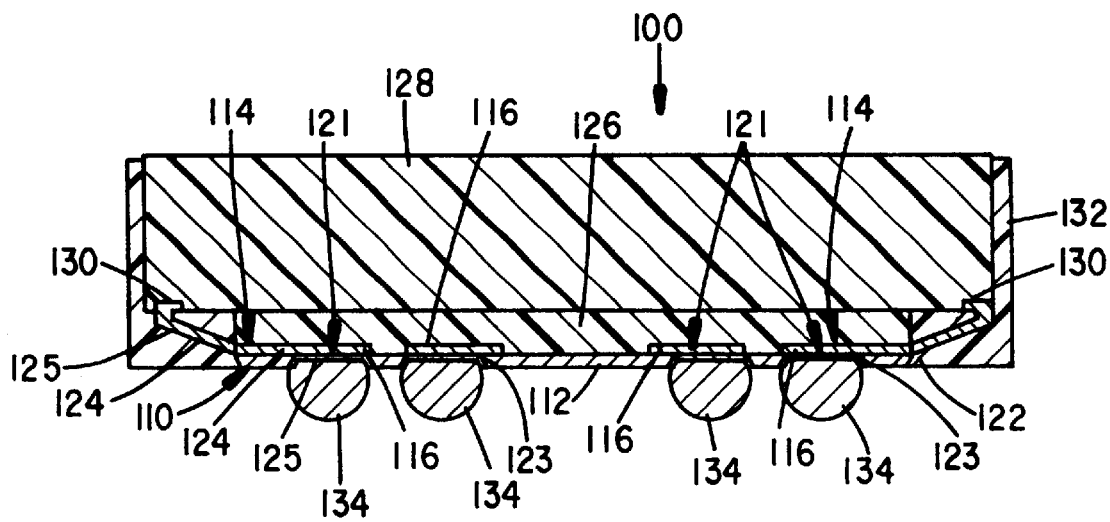
FIG. 4 is a cross sectional view illustrating an electronic package according to the present invention.

Referring now to FIG. 4, an embodiment of an electronic package 100 includes a circuit 110 including a dielectric substrate 112 and a conductive trace layer 114 mounted on the dielectric substrate 112. The conductive trace layer 114 is patterned to define a plurality of traces 116. At least a portion of the traces 116 include a first interconnect portion 120, such as a spanning or cantilevered lead extending from an edge 122 of the dielectric substrate 112 An aperture 123 extends through the dielectric substrate 112 adjacent to each trace 116. A second interconnect portion 121, such as a solderball pad, is exposed with the aperture 123.

A coverplate layer 125 is formed on a base layer 124 of the first interconnect portion 120 and second interconnect portion 121 of each trace 116. The coverplate layer 125 is formed on all of the surfaces of the first interconnect portion 120 of each trace 116 to encapsulate the first interconnect portion 120. If desired, in another embodiment, the coverplate layer 125 can be formed on less than all of the surfaces of the first interconnection region 120 of each trace 116.

A support member 126 such as an elastomeric pad, a multi-layer interposer or the like, is mounted on the conductive trace layer 114. An electronic device 128 such as a microprocessor is mounted on the support member 126. The electronic device 128 includes a plurality of bonding pads 130. Each one of the bonding pads 130 are electrically connected to the first interconnect portion 120 of a corresponding trace 116. An encapsulating material 132 may be formed over the first interconnect portions 120 of each trace 116 to provide structural support and additional environmental protection. An interconnect member 134 such as a solderball is electrically connected to the second interconnect portion 121 of each trace 116.

Figure 5:
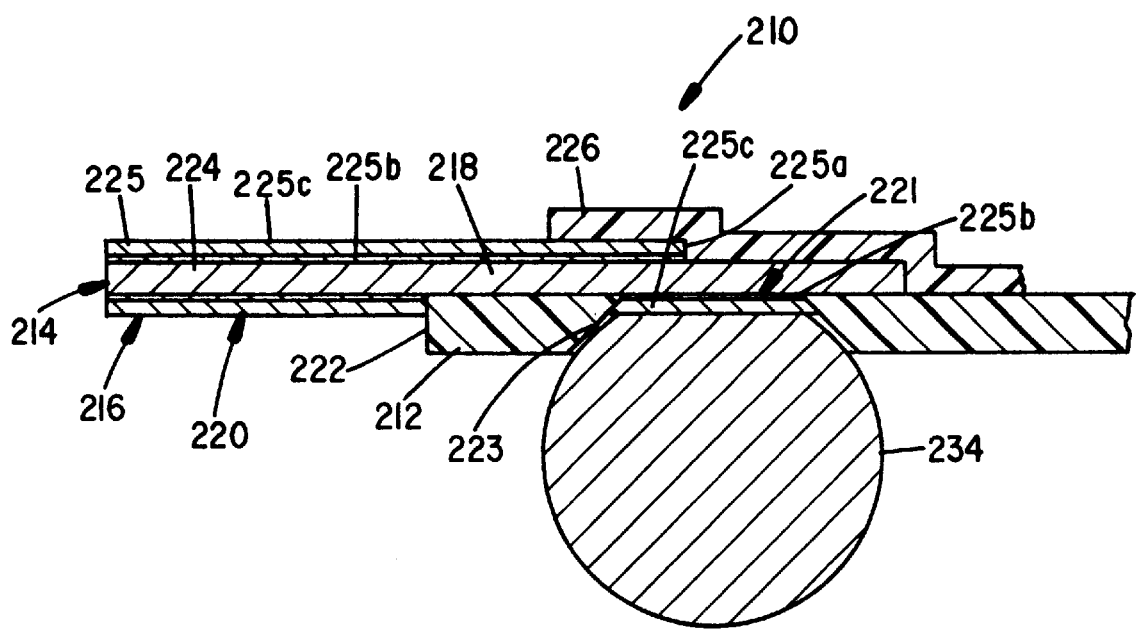
FIG. 5 is a fragmented cross sectional view cross illustrating an embodiment of a first and a second interconnect portion of a circuit according to the present invention.

Another embodiment of a circuit 210 is illustrated in FIG. 5. The circuit 210 including a dielectric substrate 212 and a conductive trace layer 214 mounted on the dielectric substrate 212. The conductive trace layer 214 is patterned to define a trace 216. The trace 216 includes a first interconnect portion 220 that extends from an edge 222 of the dielectric substrate 212. An aperture 223 extends through the dielectric substrate 212 adjacent to the trace 216. A second interconnect portion 221, such as a solderball pad, is exposed with the aperture 223. An interconnect member such as a solderball 234 is electrically connected to the second interconnect portion 221 of the trace 216.

A coverplate layer 225 is selectively deposited onto a portion of the trace 216. The coverplate layer 225 defines a coverplate edge 225a. The coverplate layer 225 includes a tie layer 225b and a surface layer 225c. The tie layer 225b is disposed between the surface layer 225c and a base layer 224 of the trace 216. In a preferred embodiment, the tie layer 225b is made of a material such as nickel and the surface layer 225c is made of a corrosion resistant material such as gold. The tie layer 225b functions as a barrier to diffusion of the base layer 224 to the surface layer 225c. In other embodiments of the present invention, the surface layer 225c is formed directly on the base layer 224, omitting the tie layer 225b.

A protective layer 226 is formed on a portion of the coverplate layer 225, extending onto a supported portion 218 of the base layer 224. The protective layer 226 may be a material such as a photoimageable covercoat, a screen printed covercoat, an adhesive film or a liquid adhesive. Liquid materials for forming the protective layer 226 may be applied to the circuit 210 by means including screen printing, ink jet printing, and the like.

An embodiment of a process for making a circuit according to the present invention, commonly referred to as additive processing, is described below. It will be appreciated that circuits fabricated using all suitable commercially known circuit fabrication techniques (e.g. subtractive processes) are applicable to the present invention. Furthermore, various known circuit constructions such as, for example, two metal layer, multi-metal layer and other known circuit constructions are applicable to the present invention.

The additive circuit fabrication process includes forming a seed layer of chrome and a seed layer of copper on a dielectric substrate such as a polyimide film. A photoresist layer is then laminated onto both sides of the dielectric substrate using standard laminating techniques such as hot rollers. The photoresist layer may be aqueous or solvent based and may be a negative-acting or positive-acting photoresist. The thickness of the photoresist is typically from about 15 to about 50 micrometers. Suitable photoresists include, for example, photoresists offered by MacDermid Incorporated under the series designations SF, CF, and MP. Specific examples include MacDermid SF310 and MP413 photoresists.

The photoresist on both sides of the dielectric substrate is then exposed to an energy source, such as ultraviolet light, white light, etc., through a mask or phototool, producing a cross-linked pattern in the photoresist. The pattern in the photoresist that is laminated to the copper layer defines the design of the conductive traces and the pattern in the photoresist that is laminated to the dielectric substrate defines the design of the features, such as apertures, formed in the dielectric substrate.

Next, the photoresist layers are developed with an appropriate solvent to expose the appropriate portions of the underlying substrate. in the case of aqueous resists, a dilute aqueous solution, such as a 0.5–1.5% sodium or potassium carbonate solution, is applied until desired patterns are obtained on both layers of photoresist. The exposed portion of the seed layer of copper is then plated using a method such as electroplating to obtain the desired trace thickness.

The laminate is then placed into a bath of concentrated base at a temperature of from about 50° C. to about 120° C. which etches the portions of the dielectric substrate not covered by the cross-linked resist. This exposes certain areas of the copper seed layer. The resist is then stripped off both sides of the laminate in a solution (typically 2–10%) of an alkaline metal hydroxide at from about 20° C. to about 80° C., preferably from about 20° C. to about 60° C. Subsequently, the copper seed layer is etched through openings in the photoresist. The copper seed layer is etched using an etchant which does not harm the polymeric film, e.g., Perma-etch®, available from Electrochemicals, Inc. The steps performed to this point in the process produce a web of circuits having copper traces on one side of the dielectric substrate and features such as apertures formed through the dielectric substrate.

One technique for selectively forming the coverplate layer includes the following steps. A dry film negative photoresist that is compatible with the coverplate chemistry (e.g. MacDermid SF310) is laminated to both sides of the web. In a re-registration expose step, the pattern of a photomask is aligned with the areas of the circuit where the coverplate layer is to be selectively plated. This is a coarse registration step in circuit constructions where the areas to be coverplated are oversized relative to the size of the coverplated area required. Both sides of the web are exposed using phototools that define the areas to be selectively coverplated. The patterns of the photoresist layers define the portions of the base layer that will be coverplated, including features such as lead portions and solder ball pads of the base layer. Next, in preparation for formation of the coverplate layer, running the web through a developing solution, as discussed previously, develops the photoresist layers.

Portions of the base layer that are exposed through the patterned photoresist layer are then coverplated with a material such as, for example, gold, tin, palladium, or combinations thereof using a method such as electroplating. After the coverplate layer is selectively formed, the photoresist is removed, exposing the underlying copper.

Another technique for selectively forming the coverplate layer is through the use of a mechanical mask. A patterned polymeric film (e.g., polyimide, polyester, polyethylene) is registered such that the pattern is aligned with the areas where the coverplate layer is to be selectively plated. Portions of the base layer that are exposed through the mechanical mask are then coverplated with gold, tin, palladium, etc. or combinations thereof, using a method such as electroplating and the mask is removed following coverplating.

Once the coverplate layer is formed, the protective layer is formed on portions thereof. The protective layer is formed such that it overlaps critical interfaces between the base layer and coverplate layer.

One method of forming the protective layer includes application of a photoimageable material onto the exposed portions of the base layer and extending onto the coverplate layer. The photoimageable covercoat is exposed through a photomask using a suitable energy source, such as UV light. The mask is patterned and registered such that the photoimageable material on the base layer and the material overlapping from the base layer onto the coverplated layer are exposed. The covercoat is then developed to remove the unexposed portions of the covercoat from the coverplated layer. Examples of suitable photoimageable covercoat materials include epoxy acrylate formulations offered by Taiyo under the PSR4000 series and by Nippon Polytech under the NPR80 series; and polyimide formulations offered by Arch Chemicals under the Probimide series and by DuPont under the Pyralin Series.

Another method of forming the protective layer includes application of a screen printable covercoat material or adhesive onto the exposed portions of the base layer and extending onto the coverplate layer. Application of the protective layer is accomplished using commercially available screen printing equipment and techniques. The covercoat is screen printed in a manner to overlap from the base layer onto portions of the coverplate layer. Examples of suitable screen printable covercoat materials include epoxy formulations offered by Ashai Chemicals under the part number CCR232.

Yet another method of forming the protective layer includes application of a patterned polymeric dry film onto the exposed portions of the base layer and extending onto the coverplate layer. Application of the protective layer may be accomplished using commercially available equipment and techniques such as screen-printing, curtain coating, roll lamination and vacuum lamination. Examples of suitable dry film materials include a thermoplastic polyimide adhesive such as that sold by DuPont under the tradename KJ polyimide, a soldermask such as that sold by Dupont under the series tradename PC2000 a thermoset adhesive such as that sold by Rogers under the tradename 1500 and a thermoset adhesive such as that sold by Toray under the tradename TSA61.

An advantage of the process described above is that the protective layer is applied after electroplating rather than the alternative technique of coverplating with a covercoat serving as a mask and as the protective layer. The protective layer is never in contact with the coverplating chemistries. Because the protective layer does not need to be stable in harsh plating chemicals, more options become available for protective layer selection. For instance, there may be a protective layer material that provides superior compliance or adhesion, or one with a more attractive coefficient of thermal expansion (CTE). Even though this protective layer material may not be stable in the presence of the plating chemistries used to fabricate the circuit, it can now be used in the circuit design as the protective layer. By avoiding contact of the protective layer with corrosive and toxic components of the plating baths, the potential for outgassing of contaminants during final assembly or end-customer use is greatly reduced. Also, the protective layer is not subjected to the possibility of thermal or chemical breakdown during plating. For these reasons, processes according to the above described process will provide a more environmentally stable circuit construction.

Another advantage of the process described above is that adhesion of the protective layer may be improved because it is applied directly to the base layer of the trace. Typical adhesives and covercoats used in electronic package constructions exhibit poor adhesion strength to gold as compared to copper and copper oxide. Accordingly, the potential for delamination of the protective layer is decreased by forming a portion of the protective layer on the base layer.

Figure 6:
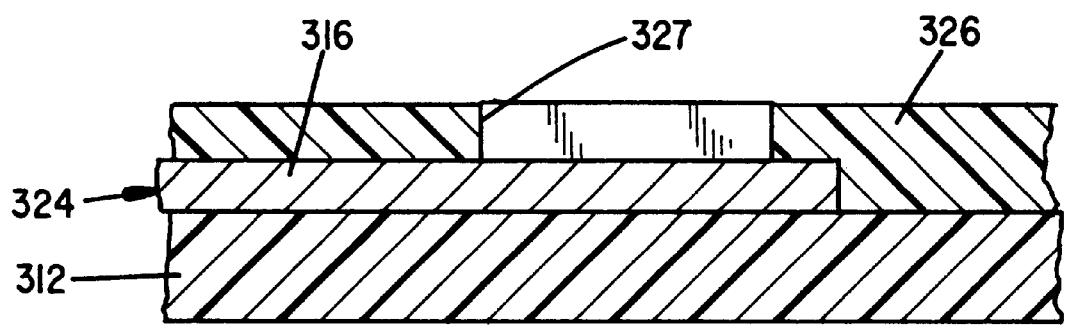
FIGS. 6–8 are cross sectional views illustrating an embodiment of a process for forming the coverplate layer and the protective layer using a flowable coverplating mask.
Figure 7:
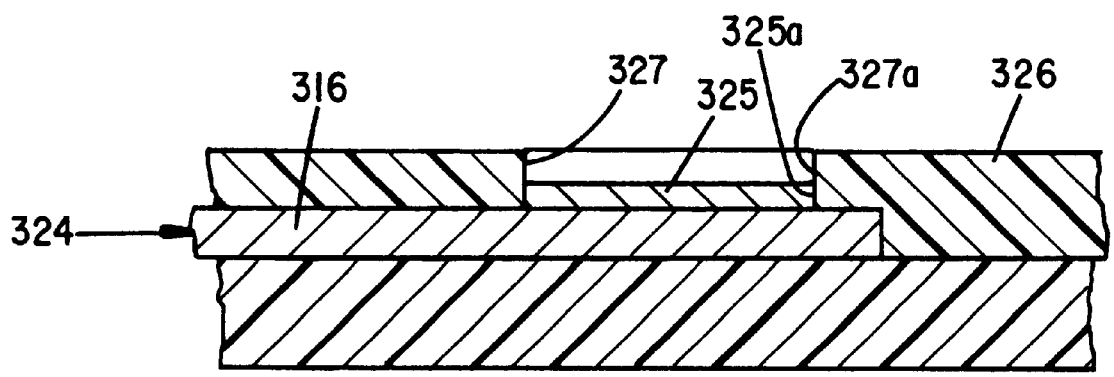
Figure 8:
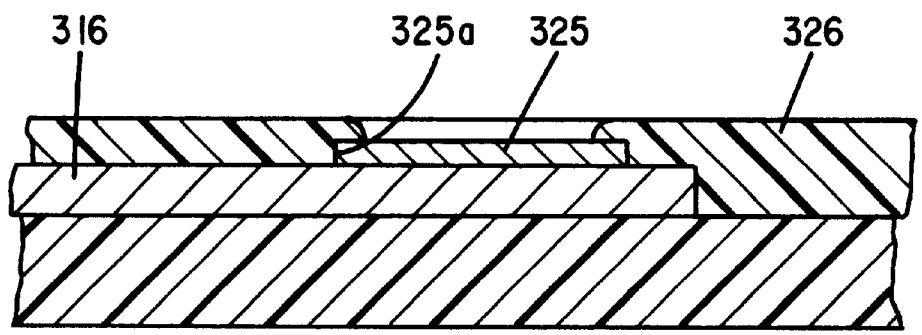

In another embodiment of a process for forming a circuit according to the present invention, FIGS. 6–8, a circuit substrate 310, FIG. 6, including a dielectric substrate 312 having a conductive base layer 324 formed thereon is provided. The base layer 324 is patterned to define one of more traces 316. A flowable coverplating mask 326, such as a thermally displaceable adhesive, is formed on the base layer 324. The coverplating mask 326 is patterned to include an opening 327 therethrough exposing the base layer 324 therein. A coverplate layer 325 is formed on the base layer 324 in the opening 327. A perimeter portion 327a of the opening 327 defines a coverplating edge 325a. The coverplating mask 326 is then exposed to heat and/or pressure to displace (flow) corresponding portions of the mask 326 from the base layer onto the coverplating layer, overlapping the coverplating edge 325a of the coverplate layer 325.

Suitable materials for the coverplating mask in the process illustrated in FIGS. 6–8 exhibit properties that permit the coverplating mask to flow when exposed to pressure and/or heat. Furthermore, the coverplating mask must be compatible with coverplating chemistries and process conditions. In addition, it is preferred that such a material will offer moisture resistance, thermal cycling/shock resistance compatible with electronic packaging requirements. Examples of commercially available adhesives suitable for use in this embodiment include a thermoplastic polyimide adhesive, such as that sold by DuPont under the tradename KJ polyimide or a thermoset adhesive such as that sold by Rogers under the tradename 1500 and that sold by Toray under the tradename TSA61.

Another example of a material suitable for use as the flowable coverplating mask is an adhesive comprising in the range of 90 to 100 weight percent epoxy-modified aromatic vinyl-conjugated diene block copolymer, wherein the block copolymer also may be hydrogenated, in the range of 10 to 0 weight percent epoxy resin based on the weight of epoxy-bearing material in the resin composition, and an epoxy catalyst or curative in an amount in the range of 0.01 to 5.00 weight percent, based on the total weight of the epoxy-bearing material. The block copolymer essentially includes a polymer block A derived from one or more aromatic vinyl compounds and a polymer block B derived from one or more compounds having a conjugated double bond.

The epoxy-modified aromatic vinyl-conjugated diene block copolymer, which preferably is an epoxidized styrene-diene block copolymer, comprises (i) a polymer block derived from polymerization of an aromatic vinyl moiety and (ii) a polymer block derived from polymerization of at least one monomer having conjugated double bonds, wherein the polymer backbone double bonds are at least partially epoxidized, as essential moieties of the chemical structure. Although one or more of aromatic vinyl compounds may be used, styrene is preferred. A variety of compounds having a conjugated double bond may be used, butadiene, isoprene, piperylene and mixtures thereof are preferred.

The copolymerization weight ratio of the aromatic vinyl compound with respect to the compound having a conjugated double bond is generally 5/95 to 70/30. Epoxy resins useful in the adhesive, encapsulant or covercoat resin compositions of the invention preferably comprise compounds which contain one or more 1,2-, 1,3- and 1,4-cyclic ethers, which also may be known as 1,2-, 1,3- and 1,4-epoxides. The 1,2-cyclic ethers are preferred. Such compounds can be saturated or unsaturated aliphatic, alicyclic, aromatic or heterocyclic, or can comprise combinations thereof. Compounds that contain more than one epoxy group (i.e., polyepoxides) are preferred.

A wide variety of commercial epoxy resins are available and are listed or described in, e.g., the *Handbook of Epoxy Resins*, by Lee and Neville, McGraw-Hill Book Co., New York (1967), *Epoxy Resins, Chemistry and Technology*, Second Edition, C. May, ed., Marcell Decker, Inc., New York (1988), and *Epoxy Resin Technology*, P. F. Bruins, ed., Interscience Publishers, New York, (1968). Any of the epoxy resins described therein may be useful in preparation of the materials of the present invention.

Curatives of the present invention can be photocatalysts, thermal catalysts, or thermal curing agents. Known photocatalysts include two general types: onium salts and cationic organometallic salts, which are both useful. Suitable thermal curing agents include aliphatic and aromatic primary and secondary amines such as those described in U.S. Pat. No. 4,684,678, incorporated herein by reference; imidazoles; quaternary ammonium salts, particularly pyridinium salts; sulfoninum salts; boron trifluoride complexes; hydrazines, and guanidines.

A patterned adhesive coverplating mask can be formed and laminated using commercially available equipment and known processes. Patterning may be performed by laser cutting of the adhesive on a release liner, through use of a die cutting operation, or by other known patterning methods. The patterns of the adhesive layer define the portion of the base layer that will be coverplated, including features such as lead portions or solder ball pads of the base layer. The exposed portions of the base layer are then coverplated with gold, tin, palladium, etc. or combinations thereof, using a method such as electroplating.

Overall, the processes according to the present invention have several key advantages. The pattern registration requirements are course such that slightly oversized coverplate regions do not negatively impact the final product. Product performance is not adversely affected by extraneous plating caused by slight de-lamination or shifting of the patterned coverplating mask. Process and raw material costs are minimized since only critical areas are coverplated. Adhesion of the protective layer may be improved because it is applied directly to the base layer of the trace.

Accordingly, it is appropriate that the appended claims be construed broadly and in a manner consistent with the scope of the embodiments and descriptions disclosed herein.

What is claimed is:

1. A printed circuit, comprising:
   a dielectric substrate;
   a conductive trace attached to a surface of the dielectric substrate, the trace including a base layer and a coverplate layer on a portion of the base layer, the coverplate layer defining coverplate edge on the base layer; and
   a protective layer covering at least a portion of coverplate edge, at least a portion of the base layer and at least a portion of the coverplate layer.

2. The circuit of claim 1 wherein the trace includes a supported portion mounted on the dielectric substrate and a first interconnect portion extending from an edge of the dielectric substrate.

3. The circuit of claim 2 wherein the coverplate layer is formed on at least a portion of the supported portion of the trace and on at least a portion of the first interconnect portion of the trace, the coverplate edge positioned on the supported portion of the trace.

4. The circuit of claim 3 further comprising an aperture extending through the dielectric substrate adjacent to the trace, a second interconnect portion of the trace exposed with the aperture the coverplate layer covering at least a portion of the second interconnect portion of the trace.

5. The circuit of claim 1 wherein the coverplate layer is made of a material selected from the group comprising gold, palladium and tin.

6. The circuit of claim 1 wherein the protective layer is made of a polymeric material.

7. The circuit of claim 1 wherein the protective layer is made of an adhesive material.

8. The circuit of claim 1 wherein the protective layer is made of a photoimageable material.

9. The circuit of claim 1 wherein the dielectric substrate is made of a flexible material.

10. The circuit of claim 9 wherein the flexible material is made of a polymeric material.

11. The circuit of claim 1 wherein the protective layer extends from the coverplate layer and the base layer onto the dielectric substrate.

* * * * *